(12) United States Patent
Wagner et al.

(10) Patent No.: US 8,408,473 B2
(45) Date of Patent: Apr. 2, 2013

(54) METHOD FOR PRODUCING AN RFID TRANSPONDER PRODUCT, AND RFID TRANSPONDER PRODUCT PRODUCED USING THE METHOD

(75) Inventors: Marco Wagner, Dresden (DE); Henry Prescher, Dresden (DE)

(73) Assignee: Smartrac Technology Dresden GmbH, Dresden (DE)

( * ) Notice: Subject to any disclaimer, the term of this patent is extended or adjusted under 35 U.S.C. 154(b) by 83 days.

(21) Appl. No.: 13/127,316

(22) PCT Filed: Nov. 3, 2009

(86) PCT No.: PCT/EP2009/064548
§ 371 (c)(1),
(2), (4) Date: Jul. 20, 2011

(87) PCT Pub. No.: WO2010/060755
PCT Pub. Date: Jun. 3, 2010

(65) Prior Publication Data
US 2011/0266351 A1    Nov. 3, 2011

(30) Foreign Application Priority Data
Nov. 3, 2008   (DE) .......................... 10 2008 055 630

(51) Int. Cl.
*G06K 19/02* (2006.01)
(52) U.S. Cl. ..................... 235/488; 235/492; 343/895
(58) Field of Classification Search ................ 235/488, 235/492; 343/895
See application file for complete search history.

(56) References Cited

U.S. PATENT DOCUMENTS

| 2005/0134463 A1 | 6/2005 | Yamazaki |
| 2011/0023289 A1* | 2/2011 | Finn ................................ 29/601 |

FOREIGN PATENT DOCUMENTS

| DE | 10 2007 054 692 A1 | 5/2009 |
| EP | 0706152 A2 | 4/1996 |
| EP | 1433368 A1 | 6/2004 |
| EP | 1742173 A2 | 1/2007 |
| WO | 98/11507 | 3/1998 |
| WO | 01/39114 A1 | 5/2001 |
| WO | 2004093002 A1 | 10/2004 |
| WO | 2008012416 A2 | 1/2008 |
| WO | 2008/058616 A1 | 5/2008 |

OTHER PUBLICATIONS

International Search Report for PCT/EP2009/064548 dated Feb. 15, 2010.

* cited by examiner

*Primary Examiner* — Allyson Trail
(74) *Attorney, Agent, or Firm* — Heslin Rothenberg Farley & Mesiti P.C.

(57) ABSTRACT

A method is provided for producing an arrangement, which, for example, may be used for further processing into a non-contact chip card or an identification document and which comprises a multi-layer structure, with a first part of an RFID antenna, at least comprising a coil-shaped antenna structure and a connecting structure, being arranged on a carrier layer and the chip being directly mounted on this part of the antenna structure and contacted, with a compensation layer being arranged thereabove, which in the area of the chip comprises an embedding opening and which comprises at least two contacting openings in the intersection area of the first part of the RFID antenna with a bridge structure, which is located on a cover layer, and subsequently the individual layers being connected to each other via lamination.

19 Claims, 2 Drawing Sheets

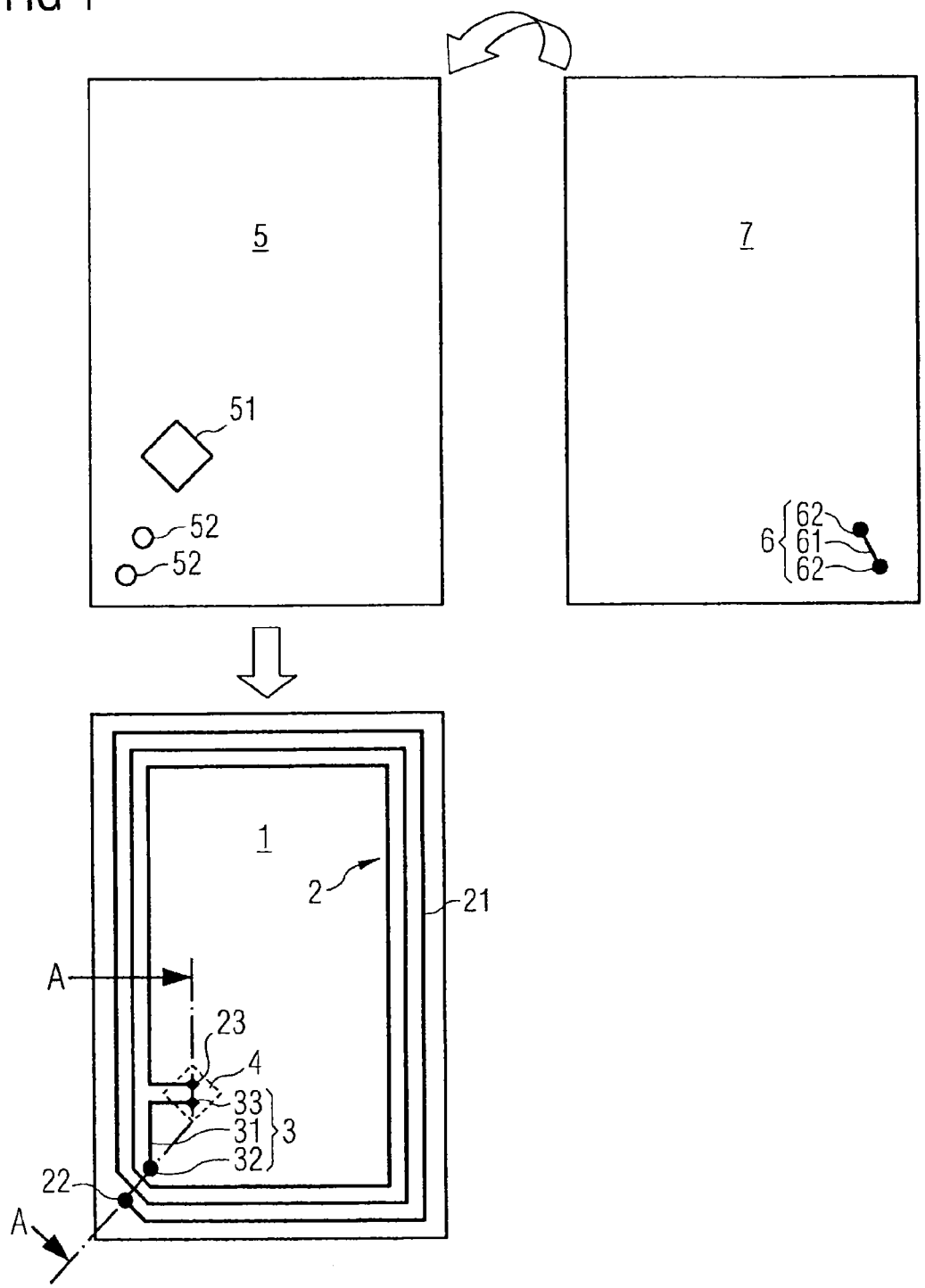

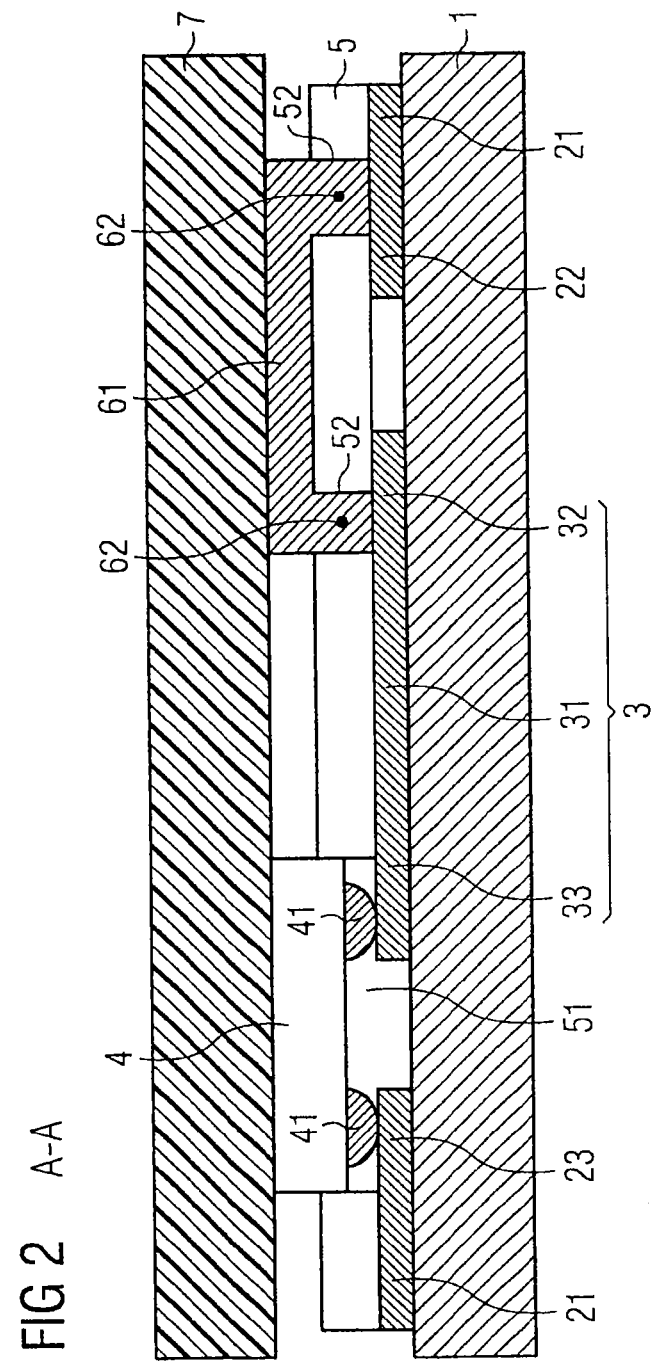

METHOD FOR PRODUCING AN RFID TRANSPONDER PRODUCT, AND RFID TRANSPONDER PRODUCT PRODUCED USING THE METHOD

CROSS REFERENCE TO RELATED APPLICATIONS

This application is a national stage filing under section 371 of International Application No. PCT/EP2009/064548 filed on Nov. 3, 2009, and published in German on Jun. 3, 2010 as WO 2010/060755 and claims priority of German application No. 10 2008 055 630.0 filed on Nov. 3, 2008, the entire disclosure of these applications being hereby incorporated herein by reference.

BACKGROUND ART

The invention relates to a method for producing an RFID transponder product and RFID transponder products produced according to said method. Here, an RFID transponder product shall be understood as a circuit arrangement having at least one transponder antenna and at least one integrated circuit (also called "chip" in the following) connected to the transponder antenna (in the following also called "antenna structure"), which is embodied for a wireless data transmission to appropriate readers. Typical examples for such planar RFID transponder products are wireless chip cards, identification documents, tickets etc., but also pre-laminates, which at a later time are further processed into the above-mentioned end products.

RFID transponder products can be subject to strong mechanical stress, which leads to particularly high requirements for the integration of the chip into the product as well as the electric connection to the transponder antenna. This stress may arise both during the production process, for example during laminating several layers to each other, as well as during the use of the products.

For this reason, preferably chips in an encapsulated structure are used, in which the chip is arranged in a separate housing. This results in a structural thickness of such ID documents or their preliminary products essentially determined by the thickness of the housed chip. For example, here, particularly the chip modules are used in some types of chip cards, in which the contacting of the chip occurs indirectly via another auxiliary carrier, e.g., a so-called lead frame. Here, the chip is first fastened via the die-bond technology on the lead frame and subsequently the connecting areas of the chip are connected via the wire-bond technology to the lead frame. Then the lead frame is cast with the chip using epoxy resin. The contacting of the chip in a circuit arrangement occurs by contacting the free connectors of the lead frame.

The chips in an encapsulated structure are preferably connected to the ends of a wire antenna comprising several windings and thus the actual RFID element is formed. Such an arrangement is embodied exemplarily in WO 2008/058616 A1.

The processing of naked chips, i.e. chips not arranged in a separate housing, allows a considerable reduction of the structural height of the products, on the one hand, however on the other hand it, increases the risk of the chip breaking and/or the contacts of the chip becoming damaged.

If instead of laying wire antennas, for example comprising several windings of insulated copper wire, planar embodied antenna structures are used, a construction becomes necessary in which one or more antenna windings can be bridged. Using this bridge construction one end of the antenna structure is connected to the first connector of the RFID chip. A second connector of the RFID chip is directly connected to the other end of the antenna structure.

Different constructive variants are known in prior art to realize the necessary electrically conducting bridges, which technologically always require the use of additional contacting material.

For example, in DE 10 2007 054 692 A1 a structure is described for an RFID inlay, in which several antenna sections are arranged on opposite substrate sides of a carrier. At least one penetrating opening is located in the substrate, by which during the metallization an electrically conducting connection is created between the antenna sections arranged on opposite sides of the substrate.

In EP 1 433 368 A1, a structure is shown, in which a tongue of the interior conductor is laid through two cuts over the other substrate side, so that the windings to be crossed are insulated in reference to the tongue by the substrate material.

WO 01/39114 A1 describes a structure, in which an insulating lacquer material is applied between the contacts of the bridge by way of serigraphy. The application of the bridge also occurs by serigraphy of a conducting lacquer coat. Subsequently the application of a protective layer comprising an insulating material occurs, also by way of serigraphy.

WO 98/011507 A1 describes a structure, in which an antenna is created by printing a conducting ink, an insulation by way of printing a dielectric, and a bridge also by printing a conducting ink.

Another example of the embodiment of the bridge construction is disclosed in EP 1 742 173 A2. In a multi-layer card structure, the structure of the antenna coils is located on a carrier layer, comprising a recess, which accepts the lower part of the chip module, i.e. the housed chip. A compensation layer is applied above the carrier layer, which comprises a recess serving to accept the upper part of the chip module, i.e. the lead frame. Additional recesses are provided to embody the antenna bridge.

First, the antenna structure is applied upon the carrier layer, then the compensation layer is laminated thereupon, the chip module with the housed chip is placed onto the antenna structure, and the bridge is printed upon the compensation layer, with all steps being embodied in the sheet format. The electrically conductive bridge is applied directly on the top of the compensation layer, e.g., by printing a conductive paste. The paste is printed here on the top of the compensation layer and here also over the openings.

There is a need for improved RFID transponder products as well as improved methods for the production of such RFID transponder products, in which the tensions acting upon the chip and its contacts can be reduced. The objective of the invention is to develop a constructive arrangement, which on the one hand protects the naked chip inside the layer structure from mechanical stress, allows a technically simple construction to realize the bridge structure, and on the other hand allows a very effective production process using roll-to-roll technologies.

These objectives are attained in a method having the features of claim 1 as well as an RFID transponder product having the features of claim 8. Advantageous embodiments and further developments are described in the dependent claims.

These objectives are attained in a method as well as an RFID transponder product having the features of the present invention.

BRIEF SUMMARY OF INVENTION

Therefore, a method is suggested for the production of an RFID transponder product, which comprises the following steps:

1. Creating a coil-shaped antenna structure free of intersections with a chip terminal and a bridge terminal as well as a connecting structure with a chip terminal and a bridge terminal on a non-conductive carrier layer with a recess-free surface.
2. Contacting a naked chip to the chip terminals of the antenna structure and the connection structure in a flip-chip technology.
3. Creating an embedding opening according to the size and location of the naked chip as well as two contact openings according to the position of the bridge material in a non-conducting compensation layer.
4. Creating a bridge structure with two connecting terminals on a non-conductive cover layer.
5. Positioning the compensation layer over the carrier layer such that the naked chip is arranged in the embedding opening of the compensation layer and the contact openings above the bridge terminals of the antenna structure and the connecting structure, and positioning the cover layer over the compensation layer such that the connecting terminal is arranged above the contact openings of the compensation layer.
6. Connecting the carrier layer, the compensation layer, and the cover layer with each other by way of lamination or adhesion.

For one trained in the art it will be obvious that particularly the processing steps to be performed at different layers can partially be executed simultaneously, i.e. at the same time. To this extent, the numbering shall not suggest any mandatory sequence to be adhered to; rather the selected numbering only serves to simplify referencing to a certain step. For example, steps 1 and/or 2 to be performed at the carrier layer may be executed while simultaneously at the compensation layer the step 3 is performed or/and simultaneously step 4 is performed at the cover layer. In the same fashion, the steps 5 and 6 can occur quasi simultaneously, as explained in the following using the example of an advantageous roll-to-roll method.

Using the above-described method RFID transponder products can be prepared that are more robust against mechanical stress, with the production occurring in a simple and cost-effective fashion in reference to methods of prior art. Simultaneously, it is more easily possible than in the past to electrically guide a conductive bridge structure in an insulated fashion over a conductive coil-shaped antenna structure.

The above-described method therefore leads to producing an arrangement, which can be further processed, for example, into a non-contact chip card or an identification document, and comprises a multi-layer structure, wherein a first part comprises an RFID antenna, including at least a coil-shaped antenna structure and a connecting structure, arranged on a first insulating layer, the carrier layer, and on this part of the antenna structure the chip is directly mounted and contacted, an insulating intermediate layer is arranged thereabove, the compensation layer, which in the area of the chip comprises a first recess equivalent to the size of the chip, which has an embedding opening and which comprises at least two second recesses, the contacting openings, in the intersection area of the first part of the RFID antenna with the second part of the RFID antenna, the bridge structure, which is located on another layer, the cover layer, and after the lamination the individual layers are connected to each other.

In other words, by the method described an arrangement is yielded, comprising a first layer (carrier layer) with a first part of an RFID antenna and the chip mounted thereupon, an intermediate layer (compensation layer) made from an insulating material with a recess for the chip (embedding opening) and at least two holes (contact openings), and an upper layer (cover layer) with a conducting bridge structure applied on it, wherein during the lamination, due to the pressure and the selection of the thickness of the insulating layer (compensation layer), the conductive layers of the lower antenna structure and the connecting structure and the upper bridge structure are pressed towards each other and are partially deformed and thus form a permanent contact. Here, the intermediate layer (compensation layer) protects the chip during the lamination.

Stated again differently, the method describes creating an arrangement comprising a multi-layer structure, in which a first part of the RFID antenna (antenna structure and the connecting structure) is arranged on a first layer (carrier layer) and directly connected to a naked chip, thereabove an insulated second layer (compensation layer) is arranged with at least one recess (contacting opening) in the area of the antenna structure and the connecting structure to form an electric contact to a second part of the antenna structure (bridge structure), and a recess (embedding opening) in the area of the chip, as well as a third layer (cover layer) arranged thereupon with a second part of the RFID antenna (bridge structure), which is then connected in a laminating process to the layers with the first part of the RFID antenna.

The materials of the carrier layer, the compensation layer, and the cover layer may for example comprise filled or unfilled plastic films, but also paper, cardboard, non-woven webs, textile materials or woven webs. Here, it is not necessary for all layers to be made from the same material. For example, the compensation layer may be a plastic film, while the carrier layer and the cover layer comprise paper. Inversely, combinations are also possible, in which the compensation layer is made from paper while the carrier layer and the cover layer are made from plastic films.

Furthermore, the method may be characterized in the antenna structure and/or the connecting structure and/or the bridge structure being produced by printing methods. Such printing methods are, for example, serigraphy, screen printing, pad printing, offset printing, inkjet or other suitable methods, in which conductive inks, conductive polymers, printing pastes, materials with inorganic or organic conductive particles, nanoparticles etc. or similar materials are used in order to create conductive structures. Alternatively, the antenna structure or/and the connecting structure or/and the bridge structure (the latter at least partially) may be produced by subtractive methods, for example by selective etching. In this case, the greater thickness of the connecting terminal of the bridge structure can be created such that at the ends of a conductive line created by etching selectively conductive material is applied, which in turn can occur by way of printing.

Here, it may be provided that the connecting terminal of the bridge structure is created with a greater thickness than the remainder of the bridge structure or/and that the bridge terminals of the antenna structure and the connecting structure are produced with a greater thickness than the remainder of the antenna structure and/or the connecting structure. The terminals thickened in this manner facilitate the secure production of an electric contact by the contact openings.

Furthermore it may be provided that two compensating layers are arranged over the top of each other, the embedding openings and the contact openings being created in the lower compensation layer and in the upper compensation layer contact openings only. The upper compensation layer therefore also covers the naked chip.

In one embodiment of the method it may be provided that the naked chip contacts the chip terminals of the antenna structure and the connecting structure via an adhesive. This embodiment has advantages compared to soldering methods, which are still possible and included in the scope of the invention. Alternatively it may be provided that the naked chip is placed directly upon the chip terminals of the antenna structure and the connecting structure, not yet completely cured, so that no additional adhesive is required.

According to another embodiment of the method it is provided that in a roll-to-roll process a multitude of continuous RFID transponder products are prepared, which subsequently are separated. Here, the source materials of the carrier layer, the compensation layer, and the cover layer are each provided in roll-to-roll processes. The materials are rolled off simultaneously and the respective processing steps are performed here. In a last step the lamination of the various layers occurs, with the layers being provided as rolls, sheets, or in a combination thereof. In this way a multitude of similar arrangements develop, which can be separated immediately, for example by cutting or punching. Alternatively the laminate web can first be wound and the separation then be performed at a later time.

The RFID transponder product produced by the method can then be connected at least on one side with another layer. In this way, for example, self-adhesive RFID labels can be produced. The other layers can here be made from a fibrous material, such as paper, cardboard, non-woven web, textile materials, or woven webs and be adhered to the RFID transponder product at one or both sides. Alternatively the RFID transponder product can be inserted between two other layers made from a plastic material, so that for example credit cards, access control cards, and similar products can be produced.

The suggested RFID transponder product showing a higher resistance to mechanical stress comprises a non-conducting carrier layer, a non conductive compensation layer, and at least one non-conductive cover layer, which are laminated together, with a non-intersecting, coil-shaped antenna structure with a chip terminal and a bridge terminal, a connecting structure with a chip terminal and a bridge terminal, as well as a naked chip, contacting the chip terminals of the antenna structure and the connecting structure in the flip-chip-technology, being arranged on the carrier layer, with an embedding opening being provided in the compensation layer according to the size and position of the naked chip, as well as a bridge structure with two connecting terminals, being arranged on the cover layer, which shows a greater thickness than the remainder of the bridge structure, and the carrier layer, the compensation layer, and the cover layer being arranged in reference to each other such that the naked chip is arranged in the embedding opening of the compensation layer, the contact openings are arranged above the bridge terminals of the antenna structure and the connecting structure, the connecting terminals are arranged above the contact openings of the compensation layer, and the connecting terminals of the bridge structure are connected to the bridge terminals of the antenna structure and the connecting structure in an electrically conductive manner.

BRIEF DESCRIPTION OF DRAWING FIGURES

In the following, an exemplary embodiment of the suggested RFID transponder product shall be explained in greater detail using the figures of the drawing, in which:

FIG. 1 shows the carrier layer, the compensation layer, and the cover layer, and FIG. 2 shows a cross-section through all three layers immediately prior to laminating.

DETAILED DESCRIPTION

FIG. 1 shows a carrier layer 1, a compensation layer 5, and a cover layer 7. Arranged on the carrier layer 1, having a continuous surface, are a non-intersecting coil-shaped antenna structure 2 with coil windings 21, a chip terminal 23, and a bridge terminal 22 as well as a connecting structure 3 with a conductor line 31, a chip terminal 33, and a bridge terminal 32.

A naked chip 4 is placed on the chip terminal 23, 33 of the antenna structure 2 and the connecting structure 3 in the flip-chip technology and contacted.

A bridge structure 6 with two connector terminals 62 is arranged on the cover layer 7, wherein the connector terminals 62 of the bridge structure 6 may comprise a greater thickness than the conductor line 61 extending between them. The cover layer 7 is shown upside down; therefore the arrangement of the bridge structure 6 seems mirrored compared to the arrangement of the contacting openings 52 on the compensation layer 5 and the bridge terminals 22, 32 of the antenna structure 2 and the connecting structure 3.

An embedding opening 51 is arranged in the compensation layer 5, matching the size and the position of the naked chip 4, as well as two contacting openings 52 according to the position of the bridge terminals 62 of the bridge structure 6.

Prior to laminating the three layers 1, 5, 7, they must be aligned in reference to each other such that the bridge terminals 22, 32 of the antenna structure 2 and the connecting structure 3 on the carrier layer 1, the contacting openings 52 of the compensation layer 5, and the connecting terminals 62 of the bridge structure 6 on the cover layer 7 are located congruently over each other. When this is achieved the embedding opening 51 of the compensation layer 5 is also located congruently over the naked chip 4 on the carrier layer 1. After laminating, an RFID transponder product is provided, which comprises a homogenous thickness and can be either used directly or further processed into other products.

FIG. 2 shows a cross-section through the three layers 1, 5, 7 immediately prior to lamination. The carrier layer 1 carries the antenna structure 2 with a bridge terminal 22 and a chip terminal 23 and the connecting layer 3 with a bridge terminal 32 and a chip terminal 33. A naked chip 4 is mounted on the chip terminals 23, 33 via flip-chip technology. For this purpose contacting means 41 are located at the bottom of the naked chip 4, which may be embodied as so-called bumps or as adhesives. An insulating compensation layer 5 with an embedding opening 51 for the chip 4 and with two contacting openings 52 for the contact terminals 62 of the bridge structure 6 are arranged on the carrier layer 1 and the antenna structure 2 located thereupon. The conducting line 61, allocated to the bridge structure 6, is arranged at the bottom of the cover layer 7. This cover layer 7, continuous towards the outside and thus protecting the antenna structure 2, the bridge structure 6, and the chip 4 from mechanical stress, is laminated to the carrier layer 1 and the other component arranged thereupon, particularly the compensation layer 5, so that a high-resistant structure develops. The lamination connects the components of the RFID transponder product in a material fashion, so that no clear spaces visible in FIG. 2 are present any longer.

In the exemplary embodiment the antenna structures are produced from electrically conducting polymer pastes. The layer thickness of the polymer pastes and the surface relief of the pastes developing from the printing and curing process as well as the selection of the paste material and the thickness of the insulating compensation layer 5 are the necessary requirements for the formation of the contacts between the bridge terminals 22, 32 of the antenna structure 2 and the connecting structure 3 on the one hand and the connecting terminal 62 of the bridge structure 6. The bridge structure 6 may also be produced in several consecutive printing steps such that the surface shows bumps in the area of the contact sites to be formed. Alternatively or in addition to the bumps on the connecting terminals 62 of the bridge structure 6 bumps may also be applied on the bridge terminals 22 and 32 of the antenna structure 2 and the connecting structure 3, i.e. on the carrier layer 1.

The structural design is embodied here such that all printing steps required for the production of the antenna, contacting, and bridge structures 2, 3, 6 are possible in highly productive roll-to-roll methods and the individual layers can be produced independently from each other. The assembly of the naked chip 4 on the carrier layer 1 can also occur without restrictions via roll-to-roll technology.

Alternatively, antenna, contacting, and bridge structures 2, 3, 6 can also be used, which are created via metallic precipitation methods or selective metal cutting methods. Another advantage of the planar created antenna, contacting, and bridge structures 2, 3, 6 comprises the possibility of embodying separate condenser structures. Here, the insulating compensation layer 5 advantageously serves as a dielectrically acting layer with a capacity precisely adjustable in a reproducible fashion via its exact thickness.

The invention is advantageous with regards to production technology in that the bridge structure 6 is printed on the cover layer 7. In this way, all layers 1, 5, 7 can be produced separately and independently from each other. Additionally, the printing of the bridge structure 6 can also occur in the roll-to-roll process. The merging of the three layers 1, 5, and 7 occurs in a last processing step.

The invention claimed is:

1. A method for production of an RFID transponder product, comprising the steps of:
  a. creating a non-intersecting coil-shaped antenna structure with a chip terminal and a bridge terminal as well as a connecting structure with a chip terminal and a bridge terminal on a non-conductive carrier layer with a continuous surface,
  b. contacting a naked chip to the chip terminals of the antenna structure and the chip terminal of the connecting structure in flip-chip technology,
  c. creating an embedding opening matching size and location of the naked chip as well as two contacting openings matching location of the bridge terminals in at least one non-conducting compensation layer,
  d. creating a bridge structure with at least two connecting terminals on a non-conducting cover layer,
  e. positioning the compensation layer over the carrier layer such that the naked chip is arranged in the embedding opening of the compensation layer and the contacting openings are arranged over the bridge terminals of the antenna structure and the connecting structure and positioning the cover layer over the compensation layer such that the connecting terminals are arranged over the contacting openings of the compensation layer, and
  f. connecting the carrier layer, the compensation layer, and the cover layer with each other by laminating or adhering.

2. A method according to claim 1, wherein the antenna structure, the connecting structure, and the bridge structure are produced by printing methods.

3. A method according to claim 1, wherein the contacting terminals of the bridge structure are produced with a greater thickness than a remainder of the bridge structure.

4. A method according to claim 1, wherein the bridge terminals of the antenna structure and the connecting structure are produced with a greater thickness than a remainder of the antenna structure and/or the connecting structure.

5. A method according to claim 1, wherein two compensation layers are arranged one over a top of an other, with the embedding opening and the contact openings being created in a lower of the compensation layers and only contacting openings being created in an upper of the compensation layers.

6. A method according to claim 1, wherein the naked chip contacts the chip terminals via an adhesive.

7. A method according to claim 1, wherein a multitude of connected RFID transponder products are produced in a roll-to-roll process, and subsequently separated.

8. A method according to claim 1, wherein the RFID transponder product is connected at least at one side with another layer.

9. A method according to claim 8, wherein the RFID transponder product is adhered to at least one other layer made from a fibrous material.

10. A method according to claim 8, wherein the RFID transponder product is inserted between two additional layers made from a plastic material.

11. An RFID transponder product comprising a non-conducting carrier layer, a non-conducting compensation layer, and a non-conducting cover layer, laminated together, with
  g. a non-intersecting coil-shaped antenna structure with a chip terminal and a bridge terminal, a connecting structure with a chip terminal and a bridge terminal, as well as a naked chip, contacting, in flip-chip technology, the chip terminals of the antenna structure and the connecting structure being arranged on the carrier layer,
  h. an embedding opening being arranged in at least one compensation layer, matching size and location of the naked chip as well as at least two contacting openings matching location of the bridge terminals,
  i. a bridge structure with two connecting terminals being arranged on the cover layer, and
  j. a carrier layer, a compensation layer, and a cover layer being arranged in reference to each other such that the naked chip is arranged in the embedding opening of the compensation layer, with the contacting openings being arranged over the bridge terminals of the antenna structure and the connecting structure, the connecting terminals being arranged over the contacting openings of the compensation layer, and the contact terminals of the bridge structure being connected to the bridge terminals of the antenna structure and the connecting structure in an electrically conducting fashion.

12. An RFID transponder product according to claim 11, wherein the antenna structure, the connecting structure, and the bridge structure are printed.

13. An RFID transponder product according to claim 11, wherein the connecting terminals of the bridge structure show a greater thickness than remainder of the bridge structure.

14. An RFID transponder product according to claim 11, wherein the bridge terminals of the antenna structure and the connecting structure show a greater thickness than remainder of the antenna structure and/or the connecting structure.

15. An RFID transponder product according to claim 11, wherein two compensation layers are arranged one over a top of an other, with a lower of the compensation layers comprising the embedding opening and the contacting openings and an upper of the compensation layers comprising only the contacting openings.

16. An RFID transponder product according to claim 11, wherein the naked chip is contacting the chip terminals via an adhesive.

17. An RFID transponder product according to claim 11, wherein the RFID transponder product is connected at least at one side with another layer.

18. An RFID transponder product according to claim 17, adhered to at least one other layer made from a fibrous material.

19. An RFID transponder product according to claim 17, embedded between two additional layers made from a plastic material.

\* \* \* \* \*